US011538795B2

(12) United States Patent
Yandoc et al.

(10) Patent No.: US 11,538,795 B2
(45) Date of Patent: Dec. 27, 2022

(54) CASCODE SEMICONDUCTOR DEVICE AND METHOD OF MANUFACTURE

(71) Applicant: NEXPERIA B.V., Nijmegen (NL)

(72) Inventors: Ricardo Lagmay Yandoc, Nijmegen (NL); Manoj Balakrishnan, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 24 days.

(21) Appl. No.: 16/875,136

(22) Filed: May 15, 2020

(65) Prior Publication Data
US 2020/0365565 A1 Nov. 19, 2020

(30) Foreign Application Priority Data
May 17, 2019 (EP) .................................. 19175165

(51) Int. Cl.
*H01L 25/07* (2006.01)
*H01L 23/31* (2006.01)
(Continued)

(52) U.S. Cl.
CPC ........ *H01L 25/072* (2013.01); *H01L 23/3121* (2013.01); *H01L 23/49541* (2013.01); *H01L 23/49575* (2013.01); *H01L 24/37* (2013.01); *H01L 24/48* (2013.01); *H01L 25/50* (2013.01); *H01L 2224/37013* (2013.01); *H01L 2224/48091* (2013.01); *H01L 2224/48175* (2013.01)

(58) Field of Classification Search
None
See application file for complete search history.

(56) References Cited

U.S. PATENT DOCUMENTS 8,455,987 B1 * 6/2013 Spann ............... H01L 23/49575
257/E23.141
2012/0033474 A1 * 2/2012 Temesi .................. H02M 7/483
363/131
(Continued)

FOREIGN PATENT DOCUMENTS

EP      2259313 A1    12/2010
FR      3059155 A1    5/2018

OTHER PUBLICATIONS

Extended European Search Report for priority European application No. EP19175165.0, 8 pages, dated Oct. 29, 2019.

*Primary Examiner* — Michelle Mandala
*Assistant Examiner* — Jordan M Klein
(74) *Attorney, Agent, or Firm* — Ruggiero, McAllister & McMahon LLC (57) ABSTRACT

This disclosure relates to a discrete cascode semiconductor device and associated method of manufacture, the device includes: a high voltage depletion mode device die having gate, source and drain terminals arranged on a first major surface thereof; a low voltage enhancement mode device die having a gate and a source terminal formed on a first major surface thereof, and a drain terminal formed on a second major surface opposite the first major surface. The drain terminal of the high voltage device die is mounted on a drain connection; the source terminal of the low voltage device die and the gate terminal of the high voltage device are mounted on a common source connection; and the drain terminal of the low voltage device die is mounted on the source terminal of the high voltage device.

20 Claims, 6 Drawing Sheets

(51) Int. Cl.
    *H01L 23/495*     (2006.01)
    *H01L 23/00*     (2006.01)
    *H01L 25/00*     (2006.01)

(56) References Cited

U.S. PATENT DOCUMENTS

| | | |
|---|---|---|
| 2013/0285260 A1 | 10/2013 | Denison et al. |
| 2014/0070786 A1 | 3/2014 | Guerra et al. |
| 2016/0172279 A1* | 6/2016 | Cho .................. H01L 23/49562 257/676 |
| 2017/0025338 A1 | 1/2017 | Padmanabhan et al. |
| 2019/0378823 A1* | 12/2019 | Lo Verde ................ H01L 25/18 |

* cited by examiner

CASCODE SEMICONDUCTOR DEVICE AND METHOD OF MANUFACTURE

CROSS REFERENCE TO RELATED APPLICATION

This application claims the benefit under 35 U.S.C. § 119(a) of European Application No. 19175165.0 filed May 17, 2019 the contents of which are incorporated by reference herein in their entirety.

BACKGROUND OF THE DISCLOSURE

1. Field of the Disclosure

The present disclosure relates to a cascode semiconductor device and associated method of manufacture. In particular, this disclosure relates to a cascode arrangement of a depletion mode transistor die with an enhancement mode transistor die, and an associated method of assembling such an arrangement.

2. Description of the Related Art

Figure 1A:
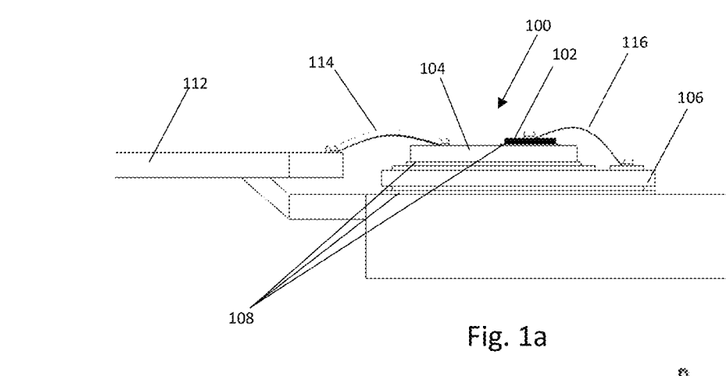
FIG. 1a shows a side view of a known semiconductor device cascode package arrangement.
Figure 1B:
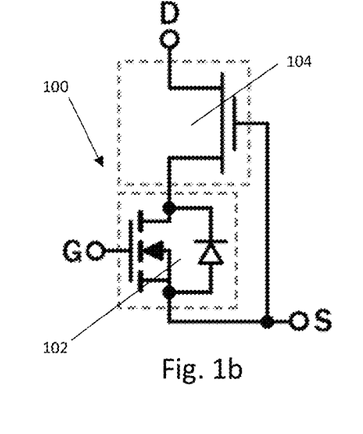
FIG. 1b shows a circuit diagram of a known cascode connection of high and low voltage transistors.

Cascode arrangements of transistors are well known, in particular for controlling normally on (or depletion mode), at zero gate-source voltage, high voltage semiconductor devices. Single package cascode arrangements can be used in switched mode applications, especially in power supplies, where efficient energy switching is required. Typically, as illustrated in FIGS. 1a and 1b the cascode arrangement 100 may comprise a normally off (or enhancement mode) low voltage device 102 is placed in series with a high voltage depletion mode device 104, by the common connection of a gate of the high voltage device 104 to a source of the low voltage device 102, and a drain of the low voltage device 102 to the source of the high voltage device 104. The high voltage depletion mode device 104 can thus be switched off when the drain source voltage of the low voltage enhancement mode device 102 reaches the threshold voltage of the high voltage device 104. The addition of a low voltage device enhancement mode device 102 in a cascode arrangement with the high voltage depletion mode device 104 therefore allows the normally on high voltage device to operate as a normally off, or enhancement mode device.

Typically, the high voltage depletion mode device 104 may be a Gallium Nitride (GaN) or Silicon Carbide (SiC) based JFET or HEMT, and the low voltage enhancement mode device 102 may be a silicon (Si) based MOSFET and both the high and low voltage device are integrated into a single semiconductor device package 100.

As shown in more detail in FIG. 1a, where both high and low voltage devices are integrated into a single semiconductor device package 100, it is common to mount the high voltage device 104 on to die pad 110. The low voltage device 102 is then mounted, or stacked, on the high voltage device 104. However, such mounting requires the use of an insulating material 106 between the die pad 110 and the high voltage device 104 to electrically insulate the high voltage device 104 from the die pad 110. The insulating material 106 may be a ceramic material. Ceramic based insulators are preferred over glass or porcelain insulators because they are more robust at high operating temperatures. In addition ceramic is also compatible with copper deposition processes to form so-called direct bond plated copper (DBPC) substrates.

Typically the insulating material 106 may be soldered 108 to the die pad 110 and likewise the high voltage device 104 may be soldered to the die pad 110. Drain and source connections 112 may made to the high voltage 104 device using appropriate wire bonds. Likewise, the carrier 110 may be electrically connected to the high voltage device 104 or the low voltage device 102 by way of electrical vias (not illustrated) through the insulating material 106 to the die pad 110.

Furthermore, the above mentioned cascode device connections between the respective gate, source and drain of the high and low voltage devices 102, 104 are currently formed by wire bonds 114, 116 to achieve the cascode configuration of FIG. 1b. Such wire bond connections suffer from the problem of DC power and switching losses due to the inductance effects in the wires during operation. Using wire-bonded connections can result in higher parasitic inductances and capacitances, which can result in so-called gate bounce. Gate bounce is a false turn on mechanism where during high frequency switching operation, the high voltage device is switched to an "on" state when it should be in an "off" state. Moreover, device resistances such as RDson may increase and wire connections can be subject to failure particularly at high voltage operation of the high voltage device.

Figure 1C:
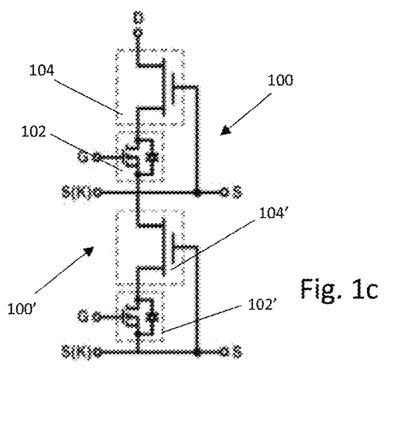
FIG. 1c shows a circuit diagram of a known half bridge arrangement of two cascode arrangements of the type shown in FIG. 1b.

First and second cascode arrangements 100, 100', as shown in the circuit diagram of FIG. 1b, may be arranged in a half-bridge configuration as shown in the circuit diagram of FIG. 1c. In the half bridge arrangement the drain of the second cascode 100' arrangement is connected to the source terminal, common with the gate of the high voltage device 104, of the low voltage device 102.

Yet further, the known arrangements described above are complex to manufacture and require large package sizes to accommodate the multiple wire bonds and the die pad.

SUMMARY

Various example embodiments are directed to issues such as those addressed above and/or others which may become apparent from the following disclosure concerning improving the electrical and thermal performance of cascode connected high voltage and low voltage transistors.

In certain example embodiments, aspects of the present disclosure involve the placement of a high voltage transistor die with respect to the low voltage transistor die in a cascode arrangement and the manner of the electrical connections therebetween.

According to an embodiment there is provided a discrete cascode semiconductor device comprising: a high voltage depletion mode device die having gate, source and drain terminals arranged on a first major surface thereof; a low voltage enhancement mode device die having a gate and a source terminals formed on a first major surface thereof and a drain terminal formed on a second major surface opposite the first major surface; wherein the drain terminal of the high voltage device die is mounted on a drain connection; the source terminal of the low voltage device die and the gate terminal of the high voltage device are mounted on a common source connection; and the drain terminal of the low voltage device die is mounted on the source terminal of the high voltage device.

The gate terminal of the low voltage device die may be mounted on a gate connection. The drain connection, common source connection and gate connection may be clip bond lead connections. The clip bond lead connections may comprise a bend intermediate a first and a second end, such that the connections are formed as gull wing leads. The clip bond lead connections may comprise mechanical support for the high voltage depletion mode device die and the low voltage enhancement mode device die.

A carrier may be mounted on a second major surface of the high voltage device, wherein the carrier comprises a insulating core arranged between two outer metal layers. A top surface of the carrier may be exposed through a top surface of a mould material.

There is also provided a semiconductor device comprising first and second cascode semiconductor devices according to an embodiment, wherein the first and second cascode semiconductor devices are arranged in a half bridge configuration.

According to an embodiment there is also provided a method of manufacturing discrete cascode semiconductor device, the method comprising: providing a high voltage depletion mode device die having gate, source and drain terminals arranged on a first major surface thereof; providing a low voltage enhancement mode device die having a gate and a source terminals formed on a first major surface thereof and a drain terminal formed on a second major surface opposite the first major surface; mounting the drain terminal of the high voltage device die on a drain connection; mounting the source terminal of the low voltage device die the gate terminal of the high voltage device on a common source connection; and mounting the drain terminal of the low voltage device die on a gate connection.

The method may further comprise mounting the drain terminal of the low voltage device die on a gate connection. The drain connection, common source connection and gate connection may be clip bond lead connections.

The method may further comprise further comprise providing a bend intermediate a first and a second end of the clip bond lead connections such that the connections are formed as gull wing leads. The clip bond lead connections may comprise mechanical support for the high voltage depletion mode device die and the low voltage enhancement mode device die.

The method may further comprise mounting a carrier on a second major surface of the high voltage device, wherein the carrier comprises a insulating core arranged between two outer metal layers. A top surface of the carrier may be exposed through a top surface of a mould material.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 2A:
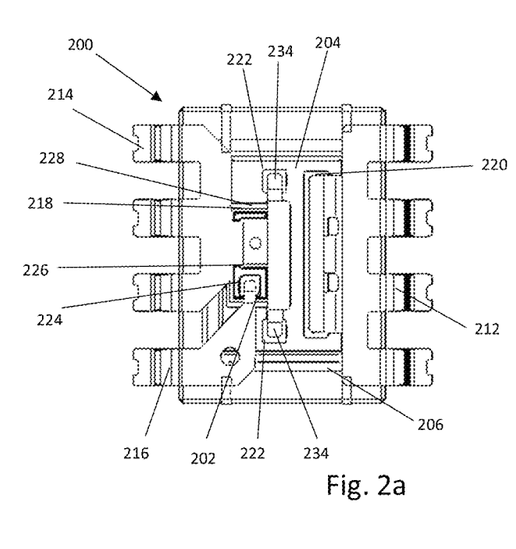
FIG. 2a illustrates a bottom view of a discrete cascode semiconductor device according to embodiments.
Figure 2B:
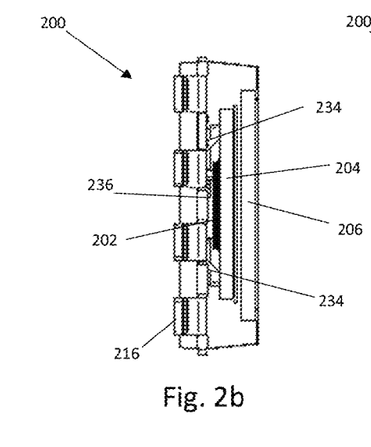
FIG. 2b illustrates a first side view of a discrete cascode semiconductor device according to embodiments.
Figure 2C:
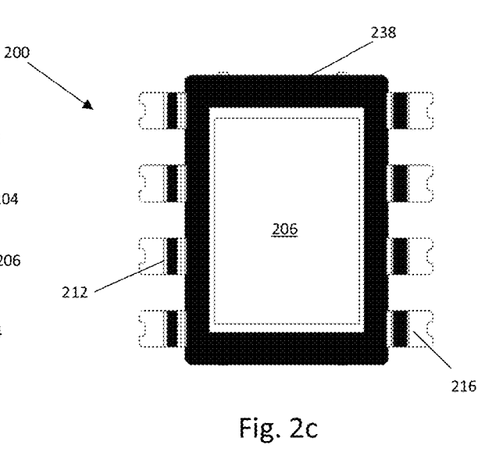
FIG. 2c illustrates a top view of a discrete cascode semiconductor device according to embodiments.
Figure 2D:
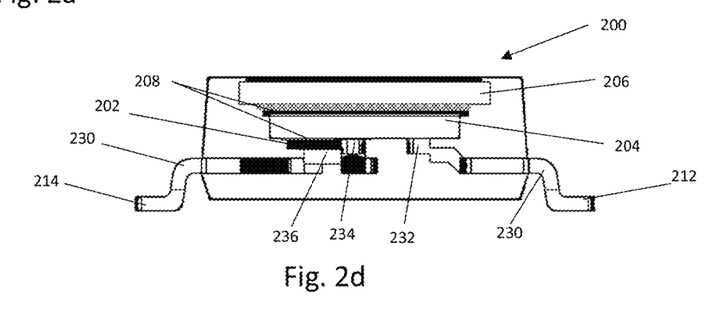
FIG. 2d illustrates a second side bottom view of a discrete cascode semiconductor device according to embodiments.

FIGS. 2a to 2d illustrates various views of a discrete cascode semiconductor device 200 according to embodiments. With reference to FIG. 2d, the discrete cascode semiconductor device 200 comprises a high voltage depletion mode device 204 (hereinafter the high voltage device) and a low voltage enhancement mode device 202 (hereinafter the low voltage device). The high voltage device 204 and low voltage device 202 are separate device dies. The low voltage and high voltage devices 202, 204 are configured and integrated within a single package to form the semiconductor device 200 according to embodiments.

As illustrated in FIG. 2a the high voltage device 204 comprises gate 222, source 228 and drain 220 terminals on a first major surface thereof, and is thus considered to be a lateral device. This is as opposed to a vertical device where at least one of the terminals, typically the drain terminal, is formed on a second major surface, opposite the first surface. The low voltage device 202 comprises a gate 224 and source 226 terminals formed on a first major surface thereof and a drain terminal 218 formed on a second major surface thereof, and is thus considered to be a vertical device. The various terminals of each of the low and high voltage devices 202, 204, as set out above, are configured and arranged for making electrical and mechanical connections thereto either by way of external leads of the semiconductor device 200 or low voltage to high voltage die connections, as discussed in more detail below.

With regard to the high voltage device 204, one or more gate terminals 222, the drain terminal 220 and the source terminal 228 are arranged on the first major surface thereof. Each of the gate 222, source 228 and drain 220 terminals are arranged so as to be co-planar on the first major surface, that is the gate, source and drain terminals 218, 222 and 220 are in the same plane on the first major surface.

For the high voltage device 204, a drain connection 212 is electrically connected to and fixedly attached to the drain terminal 220. The drain connection 212 forms the external drain connection of the cascode semiconductor device 200. Likewise for the low voltage device 202, a source connection 214 is electrically connected to fixedly attached to the source terminal 226. The source connection 214 forms the external source connection or source lead of the cascode semiconductor device 200.

Furthermore, the source connection 214 is electrically connected to and fixedly attached to the one or more gate terminals 222 of the high voltage device 204. This electrical connection of the one or more gate terminals 222 of the high voltage device 204 to the source terminal 226 of the low voltage device 202 forms with common high voltage device gate to low voltage device source connection consistent with the cascode circuit diagram discussed above with respect to FIG. 1b.

The source terminal 228 of the high voltage device 204 is electrically connected to and fixedly attached to the drain terminal 218 of the low voltage device 202. In other words, the drain terminal 218 of the low voltage device 202 is mounted on the source terminal 228 of the high voltage device 204 such that the low voltage device 202 is mounted and attached on the source terminal 228 of the high voltage device 204. To facilitate this attachment, the area of the source terminal 228 of the high voltage device 204 may be substantially equal or greater than the area of the drain terminal 218 of the low voltage device 202 to facilitate stacking of the low voltage device 202 on the source terminal 228 of the high voltage device 204. This electrical connection of the source terminal 228 of the high voltage device 204 to the drain terminal 218 form the common high voltage device source to low voltage drain connection consistent with the cascode circuit diagram discussed above with respect to FIG. 1b.

Based on the above discussion, the skilled person will therefore see that the drain of the cascode semiconductor device 200 is the drain of the high voltage device 204, the gate of the cascode semiconductor device 200 is the gate of the low voltage device 202, and the source of the cascode semiconductor device 200 is common the high voltage device source to low voltage drain. This is consistent with the cascode circuit diagram discussed above with respect to FIG. 1b.

FIGS. 2a and 2d illustrate respective external gate, source and drain connections of the cascode device 200. The external drain of the cascode device 200 comprises the electrical and mechanical attachment of the external drain connection 212 to the drain terminal 220 of the high voltage device 204. The external gate of the cascode device 200 comprises the electrical and mechanical attachment of an external gate connection 216 to the gate terminal 224 of the low voltage device 202. The external source of the cascode device 200 comprises the electrical and mechanical attachment of the external source connection 214 to both the one or more gate terminals 222 of the high voltage device 204 and the source terminal 228 of the low voltage device 202. In this way the external source connection 214 provides the common connection of the one or more gate terminals 222 of the high voltage device 204 to the source terminal 228 of the low voltage device 202 consistent with the cascode circuit diagram discussed above with respect to FIG. 1b.

The external drain connection 212, external gate connection 216 and external source connection 214 of the cascode device 200 are each arranged as respective external leads. The external gate connection 216 (gate lead), external source connection 214 (source lead), external drain connection 212 (drain lead) and form the external leads of the cascode semiconductor device 200. In this regard the respective gate, source and drain leads are each substantially elongate members, each having first and second distal ends. The respective first ends of the leads are configured and arranged for connection to contacts arranged on an external carrier such as a PCB (not illustrated). The leads may optionally comprise a bend 230 intermediate the first and the second end, such that the leads are formed as so-called "gull wing" leads.

The respective second ends of the leads are configured and arranged to allow the respective terminals of the high voltage 204 and low voltage 202 devices, as set out above, to be electrically and mechanically attached thereto. The mechanical attachment of the external drain connection 212 to the drain terminal 220 of the high voltage device 204 provides a point of mechanical support to the high voltage device. Likewise the mechanical connection of the external source connection 214 to the one or more gate terminals 222 of the high voltage device provides one or more further points of mechanical support to the high voltage device. The mechanical support provided by both the external drain connection 212 and the source connection 214 is achieved by way of upstand portions 232, 234 arranged on the respective second ends thereof.

With regard to the external drain connection 212, the upstand portion 232 is dimensioned so as to substantially match the dimensions of the drain terminal 220 of the high voltage device 204. With regard to the external source connection 214, one or more upstand portions 234 are dimensioned so as to substantially match the dimensions of the respective one or more gate terminals of the high voltage device.

Furthermore, the external source connection 214 also includes a downstand portion 236 to allow for electrical and mechanical connection of the source terminal 226 of the low voltage 202 to the external source connection 214, thus forming the common gate source connection between the high voltage and low voltage device. In addition, the arrangement of downstand also provides mechanical support for the low voltage device 202 mounted, via a common drain source connection, as discussed above, to the high voltage device 204.

As illustrated in the side views of FIG. 2b and FIG. 2d the difference in high between contact surfaces, that is the respective surfaces of the upstand and downstand contacting the respective devices is substantially equal to the thickness of the low voltage device 202.

The external gate connection 216 may also comprise a portion dimensioned so as to substantially match the dimensions of the gate terminal 224 of the low voltage device 204.

The external drain connection 212 and the external source connection 214 may each be forked or branched to provide to provide a plurality of pin-outs. The current carrying capacity of external drain connection 212 and the external source connection 214 may be substantially equal.

The above arrangement of the mechanical connection of the of the external connections to the respective terminals of the high and low voltage semiconductor devices allows for a cascode arrangement of high and low voltage devices 204, 202 that does not require a dedicated die pad or lead frame, let alone electrical connection of the high and low voltage devices to such a lead frame. In other words, the external connections act to support the high and low voltage devices of the cascode arrangement such that the cascode semiconductor device 200 according to embodiments can be considered free die pad or die pad-less. In this way the present arrangement does not have a dedicated die pad and support for the high and low voltage devices 204, 202 is achieved using the mechanical connection of two or more leads to the high voltage device 204 and/or low voltage device. In the present embodiment support for high voltage device 204 is provided by the source connection 214 and drain connection 212, and the support for the low voltage device 202 is provided by at least source connection 214. Optionally, additional support may be provided for the high voltage device 204 and the low voltage device 202 by the gate connection 216.

As illustrated in FIG. 2d, a second major surface of the high voltage device 204 may be fixedly attached by an adhesive layer 208 to a first major surface of an optional carrier 206. This adhesive layer 208, may be an insulating type adhesive since there is no electrical connection of the high voltage device 204 to the carrier 206. The carrier 206 may be a direct bond plated copper (DBPC) type carrier, comprising a three layer structure of an insulating ceramic core, such as AlN or Alumina, sandwiched between two outer copper layers. The copper layers may optionally be coated with a NiPd or an Ag metallisation layer to protect copper from oxidation.

The carrier 206 acts as insulating layer between the high voltage device to the external connection and also increases the thermal performance. The top copper layer allows for electrical connections thereto. A bottom copper layer, adjacent the high voltage device 204 is used to reduce the coefficient of thermal expansion mismatch between the high voltage device 204 and the core of the DBPC when the high voltage device is operating.

Figure 3A:
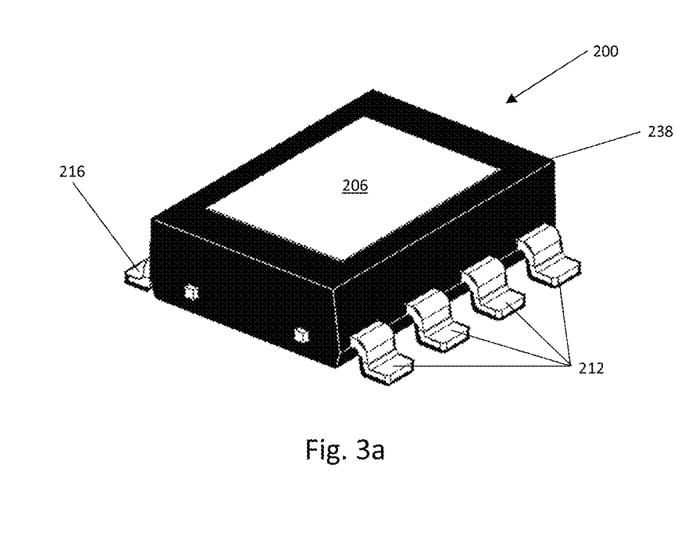
FIG. 3a illustrates a top side perspective view of a discrete cascode semiconductor device according to embodiments.
Figure 3B:
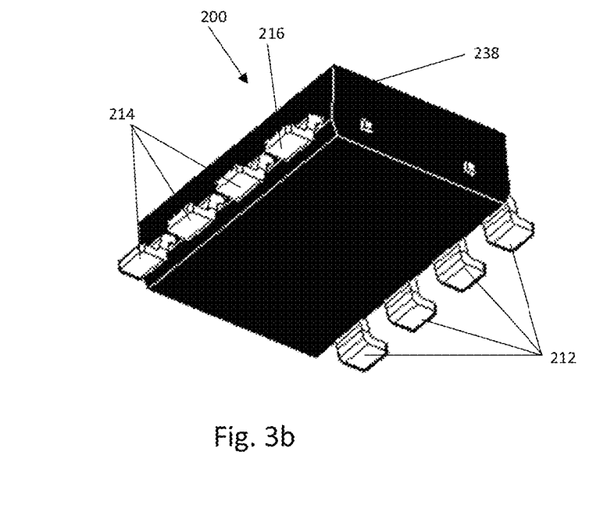
FIG. 3b illustrates a bottom side perspective view of a discrete cascode semiconductor device according to embodiments.

A second major surface of the carrier 206 is arranged to be exposed through a top surface of a mould material 238 as illustrated in FIG. 3a. As illustrated in FIGS. 3a and 3b, the mould material 238 is arranged to encapsulate the high voltage 204 and low voltage 202 semiconductor devices and partially encapsulate the external gate, source and drain connections, by leaving the respective first ends of thereof free from mould material. This allows connection of the gate, source and drain connections to an external carrier such as the PCB.

Likewise, the low voltage device 202 is fixedly attached to the high voltage device 204, forming the common drain source connection discussed above by a further adhesive layer 209. The further adhesive layer may be a an electrically conductive layer, such as solder or conductive Ag sintering.

FIGS. 4a to 4d illustrates a half bridge arrangement comprising first and second cascode devices 200, 200' of the type described above with respect to FIGS. 2a to 2d. To achieve the half bridge arrangement, consistent with the circuit of FIG. 1c, the drain connection of the first cascode device 100 is extended to connect with the source connection of the second cascode device 100'. This connection may be achieved by way of common half bridge connection 240. The half bridge connection 240 provides the drain connection to the drain terminal of the high voltage device of the first cascode device 200 and the source connection to the source and gate terminals of the high voltage device of the second cascode device 200' consistent with the arrangement of FIGS. 2a to 2d. Likewise, as with the arrangements of FIGS. 2a to 2d, a carrier 206 acts as insulating layer between the high voltage device to the external connection and also increases the thermal performance. The top copper layer allows for electrical connections thereto. A bottom copper layer, adjacent the high voltage device 204 is used to reduce the coefficient of thermal expansion mismatch between the high voltage device 204 and the core of the DBPC.

Figure 4A:
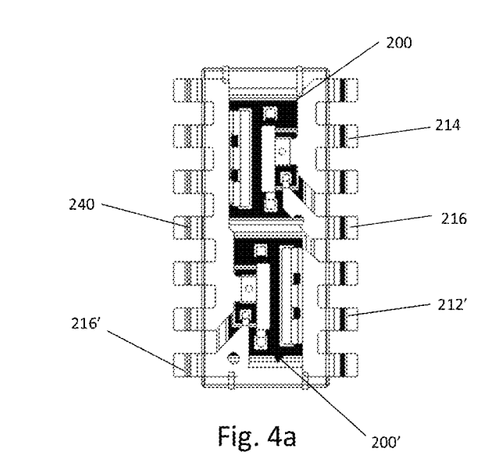
FIG. 4a illustrates a bottom view of a half bridge arrangement of cascode semiconductor devices.
Figure 4B:
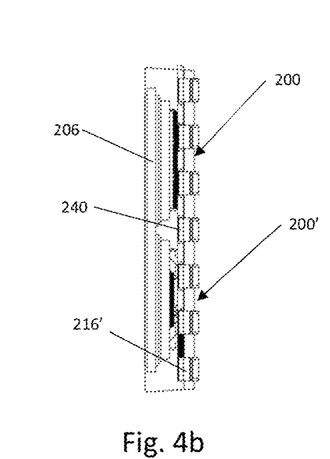
FIG. 4b illustrates a first side view of a half bridge arrangement of cascode semiconductor devices.
Figure 4C:
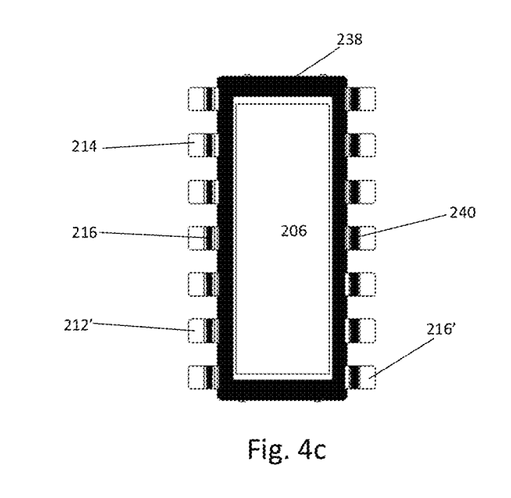
FIG. 4c illustrates a top view of a half bridge arrangement of cascode semiconductor devices.
Figure 4D:
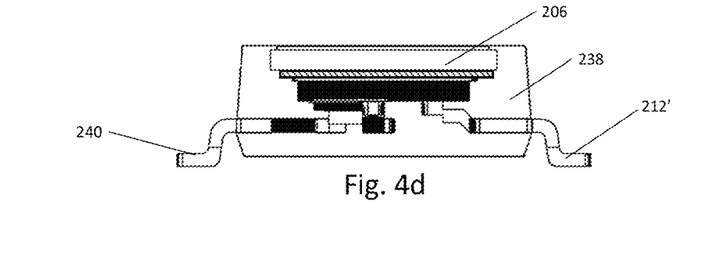
FIG. 4d illustrates a second side view of a half bridge arrangement of cascode semiconductor devices.

As with the arrangement of FIGS. 2a to 2d, a second major surface of the carrier 206 is arranged to be exposed through a top surface of a mould material 238 as illustrated in FIG. 4c.

Figure 5A:
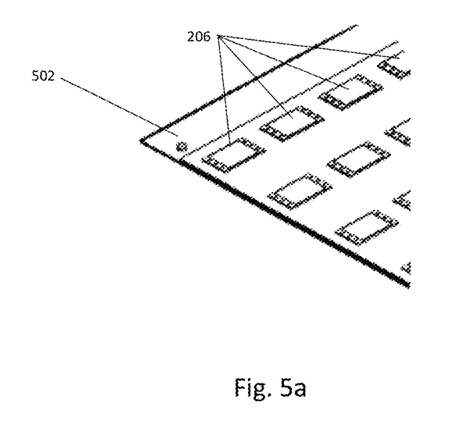
FIGS. 5a to 5g illustrate the various steps in an example process flow for assembling the cascode semiconductor device according to embodiments.
Figure 5B:
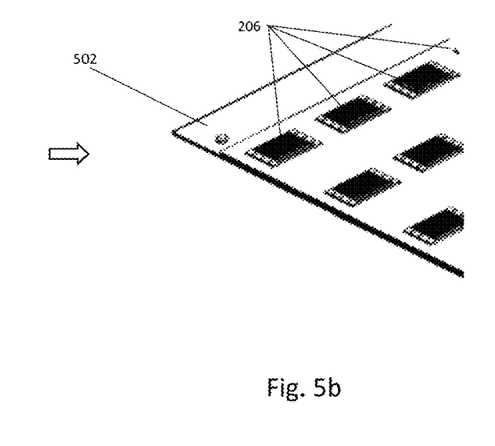

An example method of assembling the cascode semiconductor device according to embodiments will be described with reference to FIGS. 5a to 5g. The process commences by placing a plurality of insulating carriers 206 on a temporary carrier frame 502 as illustrated in FIG. 5a. The temporary carrier frame 502 may be arranged to comprise a plurality of locations, arranged as a matrix, for receiving the optional insulating carriers 206. With reference to FIG. 5b the adhesive layer 208 is formed on the carrier 206.

Figure 5C:
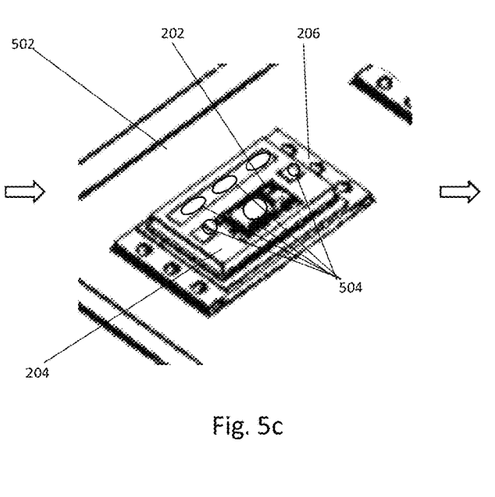
Figure 5D:
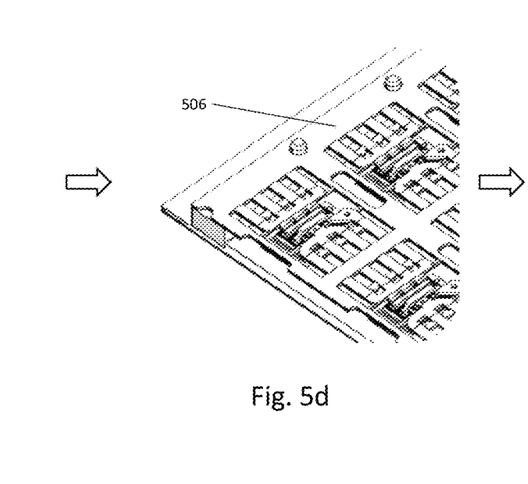

As illustrated in FIG. 5c, high voltage semiconductor devices 204 are then mounted on the insulating carriers 206 and following this, the low voltage semiconductor devices 202 are mounted or stacked on the respective high voltage semiconductor devices 204, which is consistent with the discussion above regarding the electrical connection of the source terminal of the high voltage semiconductor devices 204 to the drain terminal of the low voltage semiconductor devices 202. The low voltage semiconductor devices 202 are fixedly and electrically attached to the high voltage devices 204 by any appropriate material such as solder or conductive adhesives. Following stacking of the high and low voltage semiconductor devices an appropriate solder or conductive adhesive are provided on the terminals of the high and low voltage semiconductor devices for fixedly and electrically attaching the drain 212, source 214 and gate 216 connections, as described above with respect to FIGS. 2a to 2d.

In the case where the insulating carrier is not used, the high voltage semiconductor devices 204 may be placed directly on the temporary carrier frame 502.

The drain 212, source 214 and gate 216 connections provided as a matrix, as illustrated in FIG. 5c, are fixedly and electrically attached to respective terminals of the high voltage and low voltage semiconductor devices. In this way the respective drain 212, source 214 and gate 216 connections of a plurality of discrete cascode semiconductor devices 200 are attached in one operation.

Figure 5E:
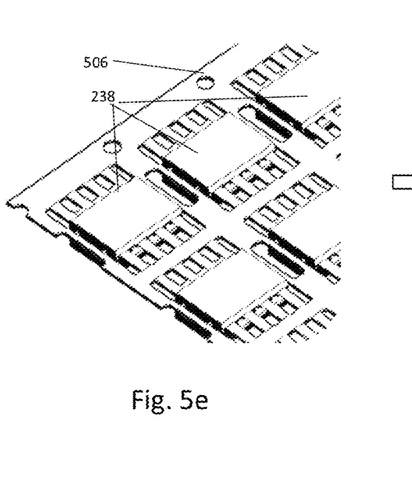
Figures 5F, 5G:
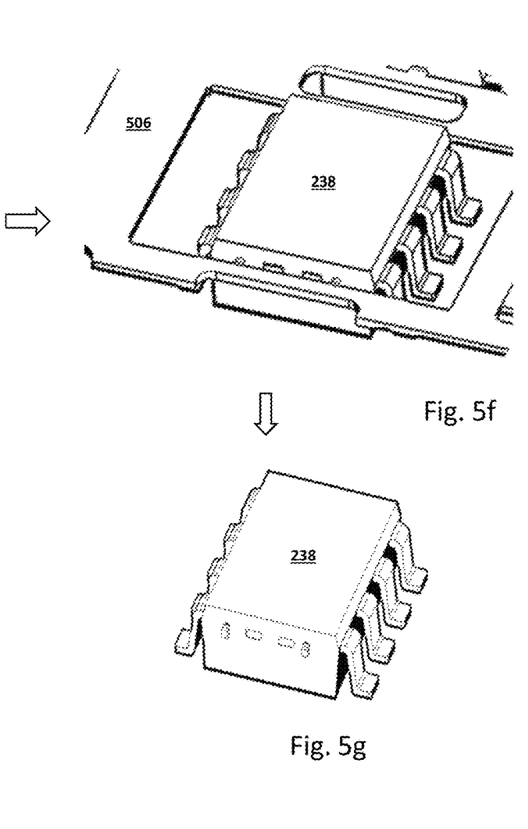

Following attachment of the drain, source and gate connections, each of the discrete cascode semiconductor devices 200 in the matrix are encapsulated by a mould compound as illustrated in FIG. 5e. The drain, source and gate connections are then separated from the matrix and formed to their final geometry as illustrated in FIG. 5f. Each of the discrete cascode semiconductor devices 200 are then singulated from the matrix forming the final discrete cascode semiconductor devices 200.

Whilst the above process flow has been described with respect to the embodiment of FIGS. 2a to 2d, the skilled person will appreciate the above example method of assembly is also applicable to the half bridge arrangement described above with respect to FIGS. 4a to 4d.

In the above described embodiments, the high voltage device die(s) may be selected from a GaN based transistor(s), GaN based HEMT(s) or SiC based transistor(s), and the low voltage device die(s) may be field effect transistor(s) such as a silicon based transistor(s).

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

What is claimed is:

1. A discrete cascode semiconductor device comprising:
   a high voltage depletion mode device die having a gate terminal, a source terminal and a drain terminal arranged on a first major surface thereof;
   a low voltage enhancement mode device die having a gate terminal and a source terminal formed on a first major surface thereof and a drain terminal formed on a second major surface opposite the first major surface;
   wherein the drain terminal of the high voltage device die is supportively mounted on a drain connection;
   the source terminal of the low voltage device die and the gate terminal of the high voltage device die are supportively mounted on a common source connection; and
   the drain terminal of the low voltage device die is supportively mounted on the source terminal of the high voltage device die.

2. The discrete cascode semiconductor device of claim 1, wherein the gate terminal of the low voltage device die is mounted on a gate connection.

3. The discrete cascode semiconductor device of claim 2, wherein the drain connection, the common source connection and the gate connection are clip bond lead connections.

4. The discrete cascode semiconductor device of claim 1, wherein the drain connection, the common source connection and a gate connection are clip bond lead connections.

5. The discrete cascode semiconductor device of claim 4, wherein the clip bond lead connections further comprise a bend intermediate, a first end and a second end, so that the connections are formed as gull wing leads.

6. The discrete cascode semiconductor device of claim 5, wherein the clip bond lead connections further comprise mechanical support for the high voltage device die and the low voltage device die.

7. The discrete cascode semiconductor device of claim 4, wherein the clip bond lead connections further comprise mechanical support for the high voltage device die and the low voltage device die.

8. The discrete cascode semiconductor device of claim 7, wherein a top surface of a carrier is exposed through a top surface of a mould material.

9. The discrete cascode semiconductor device of claim 1, further comprising a carrier mounted on a second major surface of the high voltage device die, wherein the carrier further comprises an insulating core arranged between two outer metal layers.

10. A semiconductor device comprising first and second cascode semiconductor devices according to claim 1, wherein the first and second cascode semiconductor devices are arranged in a half bridge configuration.

11. A method of manufacturing discrete cascode semiconductor device, the method comprising:
   providing a high voltage depletion mode device die having a gate terminal, a source terminal and a drain terminal arranged on a first major surface thereof;
   providing a low voltage enhancement mode device die having a gate terminal and a source terminal formed on a first major surface thereof and a drain terminal formed on a second major surface opposite the first major surface;
   supportively mounting the drain terminal of the high voltage device die on a drain connection;
   supportively mounting the source terminal of the low voltage device die and the gate terminal of the high voltage device die on a common source connection; and
   supportively mounting the drain terminal of the low voltage device die on the source terminal of the high voltage device die.

12. The method of claim 11, further comprising mounting the drain terminal of the low voltage device die on a gate connection.

13. The method of claim 12, wherein the drain connection, the common source connection and the gate connection are clip bond lead connections.

14. The method of claim 12, further comprising mounting a carrier on a second major surface of the high voltage device die, wherein the carrier further comprises a insulating core arranged between two outer metal layers.

15. The method of claim 11, wherein the drain connection, the common source connection and a gate connection are clip bond lead connections.

16. The method of claim 15, further comprising providing a bend intermediate, a first end and a second end of the clip bond lead connections such that the connections are formed as gull wing leads.

17. The method of claim 16, wherein the clip bond lead connections further comprise mechanical support for the high voltage device die and the low voltage device die.

18. The method of claim 15, wherein the clip bond lead connections further comprise mechanical support for the high voltage device die and the low voltage device die.

19. The method of claim 11, further comprising mounting a carrier on a second major surface of the high voltage device die, wherein the carrier further comprises a insulating core arranged between two outer metal layers.

20. The method of claim 19, comprising exposing a top surface of the carrier through a top surface of a mould material.

* * * * *